US006821337B2

(12) United States Patent
Bawendi et al.

(10) Patent No.: US 6,821,337 B2
(45) Date of Patent: Nov. 23, 2004

(54) PREPARATION OF NANOCRYSTALLITES

(75) Inventors: Moungi Bawendi, Boston, MA (US); Nathan E. Stott, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/455,629

(22) Filed: Jun. 6, 2003

(65) Prior Publication Data

US 2003/0209105 A1 Nov. 13, 2003

Related U.S. Application Data

(63) Continuation of application No. 09/732,013, filed on Dec. 8, 2000, now Pat. No. 6,576,291.

(51) Int. Cl.[7] .......................... B32B 5/16; C01B 19/00; C01G 11/00

(52) U.S. Cl. ............... 117/3; 117/11; 117/36; 117/75

(58) Field of Search .................. 117/3, 11, 36, 117/75; 428/402, 403

(56) References Cited

U.S. PATENT DOCUMENTS

| | | | |
|---|---|---|---|
| 5,147,841 A | * | 9/1992 | Wilcoxon .................. 502/173 |
| 5,262,357 A | | 11/1993 | Alivisatos et al. |
| 5,354,707 A | | 10/1994 | Chapple-Sokol et al. |
| 5,505,928 A | | 4/1996 | Alivisatos et al. |
| 5,525,377 A | | 6/1996 | Gallagher et al. |
| 5,537,000 A | | 7/1996 | Alivisatos et al. |
| 5,985,353 A | | 11/1999 | Lawton et al. |
| 5,990,479 A | | 11/1999 | Weiss et al. |
| 6,114,038 A | | 9/2000 | Castro et al. |
| 6,179,912 B1 | * | 1/2001 | Barbera-Guillem et al. .. 117/68 |
| 6,207,229 B1 | | 3/2001 | Bawendi et al. |
| 6,224,739 B1 | | 5/2001 | Reetz et al. |
| 6,262,129 B1 | | 7/2001 | Murray et al. |
| 6,379,635 B2 | | 4/2002 | O'Brien et al. |
| 6,576,291 B2 | * | 6/2003 | Bawendi et al. ............ 427/215 |
| 2002/0066401 A1 | * | 6/2002 | Peng et al. .................. 117/68 |

FOREIGN PATENT DOCUMENTS

| | | |
|---|---|---|
| WO | WO98/19963 | 5/1998 |
| WO | WO99/26299 | 5/1999 |
| WO | WO00/17103 | 3/2000 |
| WO | WO00/17642 | 3/2000 |
| WO | WO00/17655 | 3/2000 |
| WO | WO00/17656 | 3/2000 |
| WO | WO01/07689 | 2/2001 |

OTHER PUBLICATIONS

C. Yang et al, "Growth of CdS Nanorods in Nonionic Amphiphilic Triblock Copolymer Systems", Chem. Mater, 14, 1277–1284 (2002).*

S. L. Cumberland et al, "Inorganic Clusters as Single–Source Precursors for Preparation of CdSe, ZnSe, and CdSe/ZnS Nanomaterials", Chem. Mater, 14, 1576–1584 (2002).*

Mokari and Banin, "Synthesis and Properties of CdSe/ZnS Core/Shell Nanorods", Institute of Chemistry, The Hebrew University of Jerusalem, (2003).*

S. D. Bunge et al., "Growth and Morphology of Cadminum Chalcogenides: the Synthesis of Nanorods. Tetrapods, and Spheres from CdO and Cd(O2CCH3)2", J. Mater. Chem., 13, 1705–1709 (2003).*

A.P. Alivisatos, "Perspectives on the Physical Chemistry of Semiconductor Nanocrystals," J. Phys. Chem. 100:13226–13239 (1996).

A.P. Alvisatos, "Semiconductor Clusters, Nanocrystals, and Quantum Dots," Science 271:933–937 (1996).

A. P. Alivisatos et al., "Organization of 'nanocrystal molecules' using DNA," Nature 382:609–611 (1996).

M.G. Bawendi et al., "Luminescence properties of CdSe quantum crystallites: Resonance between interior and surface localized states," J. Chem. Phys. 96(2):946–954 (1992).

M. A. Correa–Duarte et al., "Stabilization of CdS semiconductor nanoparticles against photodegradation by a silica coating procedure," Chemical Physics Letters 286:497–501 (1998).

B.O. Dabbousi et al., "Electroluminescence from CdSe quantum–dot/polymer composites," Appl. Phys. Lett. 66 (11):1316–1318 (1995).

B.O. Dabbousi et al., "(CdSe)ZnS Core–Shell Quantum Dots: Synthesis and Characterization of a Size Series of Highly Luminescent Nanocrystallites," The Journal of Physical Chemistry B, 101(46):9463–9475 (1997).

M. Danek et al., "Synthesis of Luminescent Thin–film CdSeZnSe Quantum Dot Composites Using CdSe Quantum Dots Passivity with an Over layer of ZnS," Chem. Mater. 8(1):173–180 (1996).

M. Goa et al., "Strongly Photoluminenscent CdTe Nanocrystals by Proper Surface Modification," J. Phys. Chem. B 102:8360–8363 (1998).

M.A. Hines et al., "Synthesis and Characterization of Strongly Luminescing ZnS–Capped CdSe Nanocrystals," J. Phys. Chem. 100:468–471 (1996).

R.F. Jarvis, Jr. et al., "Solution Synthesis and Photoluminescence Studies of SMA Crystallites of Cadmium Telluride," Mat. Res. Soc. Symp. Proc. 272:227–234 (1992).

(List continued on next page.)

*Primary Examiner*—H. Thi Le
(74) *Attorney, Agent, or Firm*—Steptoe & Johnson LLP

(57) ABSTRACT

A method of manufacturing a nanocrystallite from a M-containing salt forms a nanocrystallite. The nanocrystallite can be a member of a population of nanocrystallites having a narrow size distribution and can include one or more semiconductor materials. Semiconducting nanocrystallites can photoluminesce and can have high emission quantum efficiencies.

20 Claims, No Drawings

OTHER PUBLICATIONS

X. Peng et al., "Synthesis and Isolation of a Homodimer of Cadmium Selenide Nanocrystals," Angew. Chem. Ind. Ed. Engl. 36:145–147 (1997).

A.R. Kortan et al., "Nucleation and Growth of CdSe on ZnS Quantum Crystallite Seeds, and Vice Versa, in Inverse Micelle Media," Am. Chem. Soc. 112:1327–1332 (1990).

J.-K. Lee et al., "Surface Derivatization of Nanocrystalline CdSe Semiconductors," Mat. Res. Soc. Symp. Proc. 452:323–328 (1997).

L. M. Liz-Marzán, et al., "Synthesis of Nanosized Gold-Silica Core-Shell Particles," Langmuir 12 :4329–4335 (1996).

H. Matsumoto et al., "Preparation of Monodisperse CdS Nanocrystals by Size Selective Photocorrosion," J. Phys. Chem., 100(32):13781–13785 (1996).

F.V. Mikulec, "Synthesis and Characterization of Highly Luminescent (CdSe)ZnS Quantum Dots," Mat. Res. Co. Symp. Proc. 452:359–364 (1997).

M. Müllenborn et al., "Characterization of Solution-Synthesized CdTe and HgTe," App. Phys. 56:317–321 (1993).

C.B. Murray et al., "Synthesis and Characterization of Nearly Monodisperse CdE (E = S, Se, Te) Semiconductor Nanocrystallites," J. Amer. Chem. Soc. 115:8706–8715 (1993).

M. Pehnt et al., "Nanoparticle precursor route to low–temperature spray deposition of CdTe thin films," Appl. Phys. Lett. 67(15):2176–2178 (1995).

X. Peng et al., "Epitaxial Growth of Highly Luminescent CdSe/CdS Core/Shell Nanocrystals with Photostability and Electronic Accessibility," J. Am. Chem. Soc. 119: 7019–7029 (1997).

T. Rajh et al., "Synthesis and Characterization of Surface-Modified Colloidal CdTe Quantum Dots," J. Phys. Chem. 97:11999–12003 (1997).

A.L. Rogach et al., "Synthesis and Characterization of Thiol–Stablized CdTe Nanocrystals," Ber. Bunsenges. Phys. Chem. 100:1772–1778 (1996).

L. Spanhel et al., "Photochemistry of Colloidal Semiconductors. 20. Surface Modification and Stability of Strong Luminescing CdS Particles," J. Am. Chem. Soc. 109:5649–5655 (1987).

M.L. Steigerwald et al., "Surface Derivatization and Isolation of Semiconductor Cluster Molecules," J. Am. Chem. Soc. 110:3046–3050 (1988).

A. J. Nozik et al., "Colloidal Quantum Dots of III–V Semiconductors," MRS Bulletin, 23(2):24–30 (1998).

M. A. Malik et al., "Semiconductor nanoparticles: their properties, synthesis and potential for application," So. African Journal of Science 26:55–60 (2000).

M. Green et al., "Recent advances in the preparation of semiconductors as isolated nanometric particles: new routes to quantum dots," Chem. Commun., 2235–2241 (1999).

B. Ludolph et al., "Novel single molecule precursor routes for the direct synthesis of highly monodispersed quantum dots of cadmium or zinc sulfide or selenide," Chem. Commun. 1849–1850 (1998).

Leppert, Valerie J. et al., "Structural and optical characteristics of ZnSe nanocrystals synthesized in the presence of a polymer capping agent", Materials Science and Engineering B52, pp. 89–92, (1998).

Kuno, M. et al., "The band edge luminescence of surface modified CdSe nanocrystallites: Probing the luminescing state," J. Chem. Phys., vol. 106, No. 23, pp. 9869–9882, (1997).

Steigerwald, M.L. et al., "Surface Derivatization and Isolation of Semiconductor Cluster Molecules," J. Am. Chem. Soc., vol. 110, No. 10, pp. 3046–3050 (1988).

Bawendi, M. G. et al., "X–ray structural characterization of larger CdSe semiconductor clusters," J. Chem. Phys., vol. 91, No. 11, pp. 7282–7290, (1989).

Bawendi, M. G. et al., "Electronic Structures and Photoexcited–Carrier Dynamics in Nanometer–Size CdSe Clusters. Physical Review Letters, "vol. 65, No. 11, pp. 1623–1626, (1990).

Ridley, et al., "All–Inorganic Field Effect Transistors Fabricated by Printing", Science, vol. 286, No. 5440, pp. 746–749, Oct. 22, 1999.

* cited by examiner

US 6,821,337 B2

PREPARATION OF NANOCRYSTALLITES

CROSS-REFERENCE TO RELATED APPLICATIONS

This application is a continuation application of and claims priority to U.S. application Ser. No. 09/732,013, filed on Dec. 8, 2000, now U.S. Pat. No. 6,576,291 which is incorporated by reference in its entirety.

FEDERALLY SPONSORED RESEARCH OR DEVELOPMENT

This invention was made with government support under Contract No. DMR-98-08941 from the National Science Foundation. The government may have certain rights in the invention.

TECHNICAL FIELD

The invention relates to methods of manufacturing a nanocrystallite.

BACKGROUND

Nanocrystallites having small diameters can have properties intermediate between molecular and bulk forms of matter. For example, nanocrystallites based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystallites shift to the blue (i.e., to higher energies) as the size of the crystallites decreases.

Methods of preparing monodisperse semiconductor nanocrystallites include pyrolysis of organometallic reagents, such as dimethyl cadmium, injected into a hot, coordinating solvent. This permits discrete nucleation and results in the controlled growth of macroscopic quantities of nanocrystallites. Organometallic reagents can be expensive, dangerous and difficult to handle.

SUMMARY

The invention features methods of manufacturing a nanocrystallite. The nanocrystallite has a diameter of less than 150 Å. The nanocrystallite can be a member of a population of nanocrystallites having a narrow size distribution. The nanocrystallite can be a sphere, rod, disk, or other shape. The nanocrystallite can include a core of a semiconductor material. The core can have an overcoating on a surface of the core. The overcoating can be a semiconductor material having a composition different from the composition of the core. Semiconducting nanocrystallites can photoluminesce and can have high emission quantum efficiencies. The method forms the nanocrystallite from an M-containing salt. The nanocrystallite can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. The M-containing salt can be the source of M in the nanocrystallite. An X-containing compound can be the source of the X in the nanocrystallite.

The M-containing salt can be a safe, inexpensive starting material for manufacturing a nanocrystallite relative to typical organometallic reagents which can be air sensitive, pyrophoric, or volatile. The M-containing salt is not air sensitive, is not pyrophoric, and is not volatile relative to organometallic reagents.

In one aspect, the invention features a method of manufacturing a nanocrystallite. The method includes contacting a metal, M, or an M-containing salt, and a reducing agent to form an M-containing precursor, M being Cd, Zn, Mg, Hg, Al, Ga, In or Tl. The M-containing precursor is contacted with an X donor, X being O, S, Se, Te, N, P, As, or Sb. The mixture is then heated in the presence of an amine to form the nanocrystallite. In certain embodiments, heating can take place in the presence of a coordinating solvent.

In another aspect, the invention features a method of manufacturing a nanocrystallite including contacting a metal, M, or an M-containing salt, and a reducing agent to form an M-containing precursor, contacting the M-containing precursor with an X donor, and heating the mixture to form the nanocrystallite. In certain embodiments, heating can take place in the presence of a coordinating solvent.

In another aspect, the invention features a method of manufacturing a nanocrystallite including contacting a metal, M, or an M-containing salt, an amine, and an X donor, and heating the mixture to form the nanocrystallite.

In yet another aspect, the invention features a method of overcoating a core nanocrystallite. The method includes contacting a core nanocrystallite population with an M-containing salt, an X donor, and an amine, and forming an overcoating having the formula MX on a surface of the core. In certain embodiments, a coordinating solvent can be present.

The amine can be a primary amine, for example, a $C_8$–$C_{20}$ alkyl amine. The reducing agent can be a mild reducing agent capable of reducing the M of the M-containing salt. Suitable reducing agents include a 1,2-diol or an aldehyde. The 1,2-diol can be a $C_6$–$C_{20}$ alkyl diol. The aldehyde can be a $C_6$–$C_{20}$ aldehyde.

The M-containing salt can include a halide, carboxylate, carbonate, hydroxide, or diketonate. The X donor can include a phosphine chalcogenide, a bis(silyl) chalcogenide, dioxygen, an ammonium salt, or a tris(silyl) pnictide.

The nanocrystallite can photoluminesce with a quantum efficiency of at least 10%, preferably at least 20%, and more preferably at least 40%. The nanocrystallite can have a particle size (e.g., average diameter when the nanocrystallite is spheroidal) in the range of about 20 Å to about 125 Å. The nanocrystallite can be a member of a substantially monodisperse core population. The population can emit light in a spectral range of no greater than about 75 nm at full width at half max (FWHM), preferably 60 nm FWHM, more preferably 40 nm FWHM, and most preferably 30 nm FWHM. The population can exhibit less than a 15% rms deviation in diameter of the nanocrystallites, preferably less than 10%, more preferably less than 5%.

The method can include monitoring the size distribution of a population including of the nanocrystallite, lowering the temperature of the mixture in response to a spreading of the size distribution, or increasing the temperature of the mixture in response to when monitoring indicates growth appears to stop. The method can also include exposing the nanocrystallite to a compound having affinity for a surface of the nanocrystallite.

The method can include forming an overcoating of a semiconductor material on a surface of the nanocrystallite. The semiconductor material can be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof.

The details of one or more embodiments of the invention are set forth in the description below. Other features, objects, and advantages of the invention will be apparent from the description and from the claims.

DETAILED DESCRIPTION

The method of manufacturing a nanocrystallite is a colloidal growth process. Colloidal growth occurs by rapidly injecting an M-containing salt and an X donor into a hot coordinating solvent including an amine. The injection produces a nucleus that can be grown in a controlled manner to form a nanocrystallite. The reaction mixture can be gently heated to grow and anneal the nanocrystallite. Both the average size and the size distribution of the nanocrystallites in a sample are dependent on the growth temperature. The growth temperature necessary to maintain steady growth increases with increasing average crystal size. The nanocrystallite is a member of a population of nanocrystallites. As a result of the discrete nucleation and controlled growth, the population of nanocrystallites obtained has a narrow, monodisperse distribution of diameters. The monodisperse distribution of diameters can also be referred to as a size. The process of controlled growth and annealing of the nanocrystallites in the coordinating solvent that follows nucleation can also result in uniform surface derivatization and regular core structures. As the size distribution sharpens, the temperature can be raised to maintain steady growth. By adding more M-containing salt or X donor, the growth period can be shortened.

The M-containing salt is a non-organometallic compound, e.g., a compound free of metal-carbon bonds. M is cadmium, zinc, magnesium, mercury, aluminum, gallium, indium or thallium. The M-containing salt can be a metal halide, metal carboxylate, metal carbonate, metal hydroxide, or metal diketonate, such as a metal acetylacetonate. The M-containing salt is less expensive and safer to use than organometallic compounds, such as metal alkyls. For example, the M-containing salts are stable in air, whereas metal alkyls a generally unstable in air. M-containing salts such as 2,4-pentanedionate (i.e., acetylacetonate (acac)), halide, carboxylate, hydroxide, or carbonate salts are stable in air and allow nanocrystallites to be manufactured under less rigorous conditions than corresponding metal alkyls.

Suitable M-containing salts include cadmium acetylacetonate, cadmium iodide, cadmium bromide, cadmium hydroxide, cadmium carbonate, cadmium acetate, zinc acetylacetonate, zinc iodide, zinc bromide, zinc hydroxide, zinc carbonate, zinc acetate, magnesium acetylacetonate, magnesium iodide, magnesium bromide, magnesium hydroxide, magnesium carbonate, magnesium acetate, mercury acetylacetonate, mercury iodide, mercury bromide, mercury hydroxide, mercury carbonate, mercury acetate, aluminum acetylacetonate, aluminum iodide, aluminum bromide, aluminum hydroxide, aluminum carbonate, aluminum acetate, gallium acetylacetonate, gallium iodide, gallium bromide, gallium hydroxide, gallium carbonate, gallium acetate, indium acetylacetonate, indium iodide, indium bromide, indium hydroxide, indium carbonate, indium acetate, thallium acetylacetonate, thallium iodide, thallium bromide, thallium hydroxide, thallium carbonate, or thallium acetate.

Alkyl is a branched or unbranched saturated hydrocarbon group of 1 to 100 carbon atoms, preferably 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. Optionally, an alkyl can contain 1 to 6 linkages selected from the group consisting of —O—, —S—, —M— and —NR— where R is hydrogen, or $C_1$–$C_8$ alkyl or lower alkenyl.

Prior to combining the M-containing salt with the X donor, the M-containing salt can be contacted with a coordinating solvent and a 1,2-diol or an aldehyde to form an M-containing precursor. The 1,2-diol or aldehyde can facilitate reaction between the M-containing salt and the X donor and improve the growth process and the quality of the nanocrystallite obtained in the process. The 1,2-diol or aldehyde can be a $C_6$–$C_{20}$ 1,2-diol or a $C_6$–$C_{20}$ aldehyde. A suitable 1,2-diol is 1,2-hexadecanediol and a suitable aldehyde is dodecanal.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), sulfur, bis(trimethylsilyl)sulfide ($(TMS)_2S$), a trialkyl phosphine sulfide such as (tri-noctylphosphine) sulfide (TOPS), tris(dimethylamino) arsine, an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$).

The coordinating solvent can help control the growth of the nanocrystallite. The coordinating solvent is a compound having a donor lone pair that, for example, has a lone electron pair available to coordinate to a surface of the growing nanocrystallite. Solvent coordination can stabilize the growing nanocrystallite. Typical coordinating solvents include alkyl phosphines and alkyl phosphine oxides, however, other coordinating solvents, such as pyridines, furans, and amines may also be suitable for the nanocrystallite production. Examples of suitable coordinating solvents include tri-n-octyl phosphine (TOP) and tri-n-octyl phosphine oxide (TOPO). Technical grade TOPO can be used.

The nanocrystallite manufactured from an M-containing salt grows in a controlled manner when the coordinating solvent includes an amine. Preferably, the coordinating solvent is a mixture of the amine and an alkyl phosphine oxide in a mole ratio of 10:90, more preferably 30:70 and most preferably 50:50. The combined solvent can decrease size dispersion and can improve photoluminescence quantum yield of the nanocrystallite.

The amine in the coordinating solvent contributes to the quality of the nanocrystallite obtained from the M-containing salt and X donor. The preferred amine is a primary alkyl amine, such as a $C_2$–$C_{20}$ alkyl amine, preferably a $C_8$–$C_{18}$ alkyl amine. One suitable amine for combining with tri-octylphosphine oxide (TOPO) is 1-hexadecylamine in a 50:50 mole ratio. When the 1,2-diol or aldehyde and the amine are used in combination with the M-containing salt to form a population of nanocrystallites, the photoluminescence quantum efficiency and the distribution of nanocrystallite sizes are improved in comparison to nanocrystallites manufactured without the 1,2-diol or aldehyde or the amine.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystallite average diameter and choosing the proper composition of the semiconducting material, the emission spectra of the nanocrystallites can be tuned continuously over the wavelength range of 400 nm to 800 nm. The nanocrystallite has a diameter of less than 150 Å. A population of nanocrystallites has average diameters in the range of 20 Å to 125 Å.

Nanocrystallites composed of semiconductor material can be illuminated with a light source at an absorption wavelength to cause an emission occurs at an emission wavelength, the emission having a frequency that corresponds to the band gap of the quantum confined semiconductor material. The band gap is a function of the size of the nanocrystallite. The narrow size distribution of a population of nanocrystallites can result in emission of light in a narrow spectral range. Spectral emissions in a narrow range of no greater than about 75 nm, preferably 60 nm, more preferably 40 nm, and most preferably 30 nm full width at half max (FWHM) can be observed. The breadth of the photoluminescence decreases as the dispersity of nanocrystallite diameters decreases.

The particle size distribution can be further refined by size selective precipitation with a poor solvent for the nanocrystallites, such as methanol/butanol as described in U.S. Pat. No. 6,322,901, incorporated herein by reference. For example, nanocrystallites can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystallite population can have no more than a 15% RMS deviation from mean diameter, preferably 10% RMS deviation or less, and more preferably 5% RMS deviation or less.

Transmission electron microscopy (TEM) can provide information about the size, shape, and distribution of the nanocrystallite population. Powder x-ray diffraction (XRD) patterns can provided the most complete information regarding the type and quality of the crystal structure of the nanocrystallites. Estimates of size were also possible since particle diameter is inversely related, via the X-ray coherence length, to the peak width. For example, the diameter of the nanocrystallite can be measured directly by transmission electron microscopy or estimated from x-ray diffraction data using, for example, the Scherrer equation. It also can be estimated from the UV/Vis absorption spectrum.

The method can also be used to overcoat a core semiconductor material. Overcoating can improve the emission quantum efficiency of the core. Semiconductor band offsets determine which potential shell materials provide energy barriers for both the electron and hole. For example, ZnS, ZnSe or CdS overcoatings can be grown on CdSe or CdTe nanocrystallites. An overcoating process is described in U.S. Pat. No. 6,322,901, incorporated herein by reference in its entirety. The overcoating can be grown by the method including contacting a core with a mixture including an M-containing salt and the X donor in the presence of an amine. By adjusting the temperature of the reaction mixture during overcoating and monitoring the absorption spectrum of the core, overcoated materials having high emission quantum efficiencies and narrow size distributions can be obtained.

The outer surface of the nanocrystallite includes an organic layer derived from the coordinating solvent used during the growth process. The surface can be modified by repeated exposure to an excess of a competing coordinating group. For example, a dispersion of the capped nanocrystallite can be treated with a coordinating organic compound, such as pyridine, to produce crystallites which dispersed readily in pyridine, methanol, and aromatics but no longer dispersed in aliphatic solvents. Such a surface exchange process can be carried out with any compound capable of coordinating to or bonding with the outer surface of the nanocrystallite, including, for example, phosphines, thiols, amines and phosphates. The nanocrystallite can be exposed to short chain polymers which exhibit an affinity for the surface and which terminate in a moiety having an affinity for the suspension or dispersion medium. Such affinity improves the stability of the suspension and discourages flocculation of the nanocrystallite.

The nanocrystallites can be suitable for a variety of applications, including those disclosed in copending and commonly owned U.S. Pat. Nos. 6,251,303 and 6,326,144, and U.S. application Ser. No. 09/160,458, filed Sep. 24, 1998, each of which is incorporated herein by reference in its entirety. For example, the nanocrystallites can be used in optoelectronic devices including electroluminescent devices such as light emitting diodes (LEDs) or alternating current thin film electroluminescent devices (ACTFELDs).

EXAMPLES

Synthesis of Nanocrystallites

All reactions were done under a dry argon atmosphere. Tri-octylphosphine oxide (TOPO) was obtained from Strem. Tri-octylphosphine (TOP) was obtained from Fluka, 1-hexadecylamine was obtained from Aldrich, and cadmium 2,4-pentanedionate (cadmium acetylacetonate, $Cd(acac)_2$) was obtained from Alfa. Other starting materials were obtained from Aldrich.

A Cd precursor mixture was prepared by combining 8 mL (18 mmol) of tri-octyl phosphine (TOP), 427.4 mg (1.38 mmol) of $Cd(acac)_2$, and 792.6 mg (3.07 mmol) of 1,2-hexadecanediol. The mixture was degassed at 100 millitorr and purged with dry argon three times. The mixture was then stirred at 100° C. for 90 minutes resulting in a waxy gel. The Cd precursor was cooled to room temperature.

A 1 M stock solution of trioctylphosphine selenide (TOPSe) was prepared by dissolving 0.1 mol of selenium shot in 100 mL of TOP under a dry argon atmosphere. 2 mL of one molar TOPSe in TOP were stirred into the Cd precursor mixture and the combination of materials was loaded into a syringe under dry argon.

9.25 g (24 mmol) of tri-octylphosphine oxide (TOPO) and 5.75 g (24 mmol) of 1-hexadecylamine were dried and degassed at 160° C. and 60 millitorr for two hours with stirring in a three-neck round-bottom flask. The atmosphere of the flask was backfilled with dry argon at one atmosphere and the temperature of the molten reaction solvent was increased from 160° C. to 360° C. The reaction mixture in the syringe was quickly injected into the stirring solvent, and the heat was temporarily removed. The temperature dropped to 265° C. Heat was then added to increase the temperature to 275° C. for controlled growth of the CdSe nanocrystallites.

Periodically, aliquots of the reaction solution were removed through a septum via syringe and diluted in hexane for visible absorption spectral analysis of the nanocrystallite growth. Once the target nanocrystallite size was obtained, the temperature of the reaction solution was lowered to 100° C. and the growth solution was stirred overnight.

The synthetic procedure yielded CdSe nanocrystallites using cadmium iodide, cadmium bromide, cadmium carbonate, cadmium acetate, or cadmium hydroxide as the Cd-containing starting material. When cadmium metal was used as the Cd-containing starting material, the Cd precursor material was prepared by combining the cadmium metal, TOP and 1,2-hexadecanediol until the metal dissolved. The precursor solution was then combined with the TOPSe stock solution and was stirred for 12 hours at 100° C. This solution was then combined with the coordinating solvent to grow the nanocrystallites.

Absorption and Photoluminescence Spectra of Nanocrystallites

The absorption spectrum was taken with a Hewlett Packard Model 8453 Ultraviolet-Visible (UV/Vis) Spectrometer. The emission spectrum was taken with a SPEX 1680 0.22 m Double Spectrometer, using rhodamine 590 in methanol as a quantum efficiency reference.

The average diameter of the CdSe nanocrystallites was estimated from the UV/Vis absorption spectrum to be roughly 38 Å after growth. Resolution of the $1^{st}$, $2^{nd}$, and $3^{rd}$ features of the absorption spectrum indicates that the size distribution of the nanocrystallites was relatively narrow, less than 5% RMS deviation. The quantum efficiency of the CdSe nanocrystallite emission when irradiated with 500 nm light was 10.25%±0.75%.

A number of embodiments of the invention have been described. Nevertheless, it will be understood that various modifications may be made without departing from the spirit and scope of the invention. For example, the methods and products described herein primarily related to methods of preparing cadmium selenide or zinc sulfide materials. However, it will be apparent to those skilled in the art that these methods can be extended to other metal chalcogenide and pnictide materials. Accordingly, other embodiments are within the scope of the following claims.

What is claimed is:

1. A method of synthesizing a nanocrystal comprising combining a metal-containing non-organometallic compound, a coordinating solvent, and a chalcogen source to form a nanocrystal.

2. The method of claim 1, wherein the coordinating solvent includes a compound having an oxygen- or nitrogen-coordinating atom.

3. The method of claim 2, wherein the compound having an oxygen- or nitrogen-coordinating atom is a 1,2-diol.

4. The method of claim 2, wherein the compound having an oxygen- or nitrogen-coordinating atom is an aldehyde.

5. The method of claim 2, wherein the compound having an oxygen- or nitrogen-coordinating atom is an amine.

6. The method of claim 1, wherein the chalcogen source includes S.

7. The method of claim 1, wherein the chalcogen source includes Se.

8. The method of claim 1, wherein the chalcogen source includes Te.

9. The method of claim 1, wherein the metal-containing non-organometallic compound includes cadmium.

10. The method of claim 9, wherein the coordinating solvent includes a 1,2-diol, an aldehyde, or an amine.

11. The method of claim 10, wherein the chalcogen source includes S, Se or Te.

12. The method of claim 10, wherein the metal-containing non-organometallic compound is CdO.

13. The method of claim 1, wherein the metal-containing non-organometallic compound includes cadmium, zinc, magnesium, mercury, aluminum, gallium, indium, or thallium.

14. The method of claim 2, wherein the coordinating solvent and the compound having an oxygen- or nitrogen-coordinating atom are the same chemical.

15. The method of claim 1, wherein the nanocrystal is a member of a substantially monodisperse population of nanocrystals.

16. The method of claim 15, wherein the coordinating solvent includes a 1,2-diol, an aldehyde, or an amine.

17. The method of claim 1, further comprising forming a semiconductor overcoating on the nanocrystal.

18. The method of claim 1, further comprising heating the metal-containing non-oraganometallic compound, the coordinating solvent, and the chalcogen source at a temperature sufficient to form the nanocrystal.

19. A method of manufacturing a biological labeling reagent comprising combining a metal-containing non-organometallic compound, a coordinating solvent, and a chalcogen source to form a nanocrystal.

20. A method of manufacturing an LED comprising combining a metal-containing non-organometallic compound, a coordinating solvent, and a chalcogen source to form a nanocrystal.

* * * * *

UNITED STATES PATENT AND TRADEMARK OFFICE
CERTIFICATE OF CORRECTION

| | | |
|---|---|---|
| PATENT NO. | : 6,821,337 B2 | Page 1 of 1 |
| APPLICATION NO. | : 10/455629 | |
| DATED | : November 23, 2004 | |
| INVENTOR(S) | : Bawendi et al. | |

It is certified that error appears in the above-identified patent and that said Letters Patent is hereby corrected as shown below:

Col. 1, line 11-16
In the section FEDERALLY SPONSORED RESEARCH OR DEVELOPMENT, the text "This invention was made with government support under Contract No. DMR-98-08941 from the National Science Foundation. The government may have certain rights in the invention." should read -- This invention was made with Government support under Grant No. DMR9808941, awarded by the National Science Foundation. The Government has certain rights in this invention. --

Signed and Sealed this
Third Day of May, 2011

David J. Kappos
*Director of the United States Patent and Trademark Office*